United States Patent
Klien (10) Patent No.: US 11,448,669 B2
(45) Date of Patent: Sep. 20, 2022

(54) CURRENT SENSOR AND MEASURING METHOD FOR THE SWITCHED SENSING OF AN ALTERNATING CURRENT

(71) Applicant: TRIDONIC GMBH & CO KG, Dornbirn (AT)

(72) Inventor: Dietmar Klien, Mäder (AT)

(73) Assignee: Tridonic GmbH & Co KG, Dornbirn (AT)

( * ) Notice: Subject to any disclaimer, the term of this patent is extended or adjusted under 35 U.S.C. 154(b) by 0 days.

(21) Appl. No.: 17/311,396

(22) PCT Filed: Dec. 12, 2019

(86) PCT No.: PCT/EP2019/084975
§ 371 (c)(1),
(2) Date: Jun. 7, 2021

(87) PCT Pub. No.: WO2020/126858
PCT Pub. Date: Jun. 25, 2020

(65) Prior Publication Data
US 2022/0026471 A1    Jan. 27, 2022

(30) Foreign Application Priority Data

Dec. 18, 2018 (DE) ............. 10 2018 132 656.4

(51) Int. Cl.
*G01R 19/00* (2006.01)
*H05B 45/345* (2020.01)
(Continued)

(52) U.S. Cl.
CPC ..... *G01R 19/0053* (2013.01); *G01R 19/0092* (2013.01); *H02M 1/32* (2013.01);
(Continued)

(58) Field of Classification Search
CPC ............. H05B 45/14; H05B 45/3725; G01R 19/0092; H02M 1/32; H02M 7/217; H02M 7/219; H02M 1/0009; H02M 7/5395
See application file for complete search history.

(56) References Cited

U.S. PATENT DOCUMENTS

| 7,598,685 B1 * | 10/2009 | Shteynberg | .......... H05B 45/385 315/308 |
| 2010/0213858 A1 * | 8/2010 | Kuroki | .................. H05B 45/14 315/210 |
| 2010/0213859 A1 * | 8/2010 | Shteynberg | .......... H05B 45/385 315/224 |

(Continued)

FOREIGN PATENT DOCUMENTS

| CN | 101118266 A | * | 2/2008 | |
| CN | 108132375 A | * | 6/2018 | ......... G01R 19/0092 |

(Continued)

OTHER PUBLICATIONS

PCT Search Report dated Apr. 14, 2020 in parent application PCT/EP2019/084975.

*Primary Examiner* — Abdullah A Riyami
*Assistant Examiner* — Syed M Kaiser
(74) *Attorney, Agent, or Firm* — Andrus Intellectual Property Law, LLP (57) ABSTRACT

A current sensor (12) serves to detect an alternating current (16). The current sensor (12) comprises a coupler (20) designed to decouple a proportional part of the alternating current (16) as a measurement current (22). In addition, the current sensor (12) comprises a switching terminal designed to feed in a switching signal (15). The current sensor (12) furthermore includes a switchable rectifier (21) designed to rectify the measurement current (22) in a manner controlled by the switching signal (15) and to output it as a rectified measurement current (Vsense).

10 Claims, 7 Drawing Sheets

(51) Int. Cl.
  *H02M 1/32* (2007.01)
  *H02M 7/5395* (2006.01)
  *H05B 45/14* (2020.01)
  *H05B 45/325* (2020.01)

(52) U.S. Cl.
  CPC .......... *H02M 7/5395* (2013.01); *H05B 45/14* (2020.01); *H05B 45/325* (2020.01); *H05B 45/345* (2020.01)

(56) References Cited

U.S. PATENT DOCUMENTS

| | | | | |
|---|---|---|---|---|
| 2011/0121754 | A1* | 5/2011 | Shteynberg | H05B 45/3575 315/294 |
| 2012/0153866 | A1* | 6/2012 | Liu | H02M 3/33561 363/21.18 |
| 2014/0016386 | A1* | 1/2014 | Weis | H02M 3/1588 363/125 |
| 2014/0042933 | A1* | 2/2014 | Livschitz | H05B 45/14 315/307 |
| 2014/0268951 | A1* | 9/2014 | Wang | H02M 1/08 363/78 |
| 2015/0180355 | A1* | 6/2015 | Freeman | H02M 1/12 363/21.04 |
| 2015/0305112 | A1* | 10/2015 | Klien | H05B 45/44 315/85 |
| 2016/0344233 | A1* | 11/2016 | Paatero | H02M 7/04 |
| 2017/0005565 | A1* | 1/2017 | Bai | H02M 1/4258 |
| 2017/0099011 | A1* | 4/2017 | Freeman | H02M 7/06 |

FOREIGN PATENT DOCUMENTS

| | | |
|---|---|---|
| DE | 10 2014 215 835.4 | 2/2015 |
| WO | 2014060899 | 4/2014 |

* cited by examiner

CURRENT SENSOR AND MEASURING METHOD FOR THE SWITCHED SENSING OF AN ALTERNATING CURRENT

CROSS REFERENCE TO RELATED APPLICATIONS

The present application is the U.S. national stage application of international application PCT/EP2019/084975 filed Dec. 12, 2019, which international application was published on Jun. 25, 2020 as International Publication WO 2020/126858 A1. The international application claims priority to German Patent Application 10 2018 132 656.4 filed Dec. 18, 2018.

FIELD OF INVENTION

The invention relates to a current sensor and a method for detecting an alternating current, in particular for detecting a secondary-side alternating current in a preferably isolated DC-DC converter.

BACKGROUND OF THE INVENTION

When a resonant converter, in particular a DC-DC converter with pulse-width modulation (PWM) is in operation, the average current is frequently detected by a connected load, in particular one or more LEDs, via a current converter with rectifier. Due to the diode capacitance of the power rectifier in the DC-DC converter, a measurement error thereby results. During the switch-off phase of the half-bridge of the DC-DC converter, the resonant circuit oscillates to zero and an alternating current, which does not contribute to the LED current since its mean value is 0, flows via the diode capacitors. However, this alternating current is also measured by the rectifier on the secondary side of the current transformer.

This leads to an inaccurate measurement of the current, which in turn leads to inaccurate regulation of the DC-DC converter.

A conventional converter is disclosed, for example, in document WO 2016/016044.

SUMMARY OF THE INVENTION

The invention is based on the object of providing a current sensor and a measuring method for detecting an alternating current which, irrespective of a mode of operation of the converter, achieves a high measuring accuracy without requiring complex hardware.

The object is achieved according to the invention by the features described herein. Advantageous developments are the subject-matter of the respectively related dependent claims.

A current sensor according to the invention is used for detecting an alternating current. The current sensor comprises a coupler which is designed to decouple a proportional part of the alternating current as a measurement current. In addition, the current sensor comprises a switching terminal which is designed for feeding-in a switching signal. In addition, the current sensor includes a switchable rectifier which is designed to rectify the measurement current in a manner controlled by the switching signal and output it as a rectified measurement current. The switchability of the rectifier by means of the switching signal enables a deactivation of the rectifier at times when only a fault current would arise.

The switchable rectifier preferably comprises a switching device which is designed to switch rectification by the switchable rectifier on and off in a manner controlled by the switching signal. This ensures a particularly simple implementation of the current sensor.

The switching device is preferably implemented in such a way that the ground-side rectifying elements of a bridge rectifier are replaced by active switching elements with preferably integrated freewheeling diode, such as transistors, in particular MOSFETs. If these two lower rectifying elements are controlled, this can take place without complex high-side control. Furthermore, an external freewheeling diode can be dispensed with by using the integrated freewheeling diode.

The active switching elements are preferably formed by transistors, such as MOSFET or GaN-FET.

In this case, the switching device preferably comprises at least two transistors which are designed to switch rectification by the switchable rectifier on and off in a manner controlled by the switching signal. This enables a particularly simple implementation of the switching device.

The switchable rectifier preferably comprises a first transistor, a first diode, a second transistor and a second diode. At a first node, the first transistor and the second transistor are connected in parallel on the input side. At a second node, the first diode is connected in series with the first transistor. At a third node, the second diode is connected in series with the second transistor. At a fourth node, the first diode and the second diode are connected in parallel on the output side. A particularly simple implementation of the switched rectifier is thus achieved.

The switched rectifier is preferably configured to receive the measurement current at the second node and the third node and to output the rectified measurement current at the first node and the fourth node. A simple implementation of the switched rectifier is thus achieved.

A converter according to the invention comprises a primary-side converter device, a coupler, a secondary-side converter device and a current sensor described above. A particularly simple design of the converter is thus achieved.

The switching signal is preferably based on switching times of the primary-side converter device. A particularly simple implementation of the switching signal is thus achieved.

The converter furthermore preferably includes a switching signal generator designed to generate the switching signal on the basis of the switching times of the primary-side converter device. A particularly simple generation of the switching signal is thereby ensured.

The switching signal generator is preferably designed to generate the switching signal as an inverse of the switching processes of a half-bridge of the primary-side converter device. A particularly simple generation of the switching signal is thus achieved.

Here, the switchable rectifier is preferably designed to rectify the measurement current during a switch-on phase of the half-bridge of the primary-side converter device, and to short-circuit, i.e., to also not rectify, the measurement current during a switch-off phase of the half-bridge of the primary-side converter device. This ensures that fault currents are not detected during the switch-off phase of the half-bridge.

The primary-side converter device is preferably designed to operate on the basis of the rectified measurement current. The resulting control loop ensures a particularly precise adjustment of the current by the load.

A circuit according to the invention includes a previously described converter and an LED module. A particularly precise control of the LED module is thus achieved.

A method according to the invention is used to detect an alternating current. The method includes decoupling a proportional part of the alternating current as a measurement current, feeding in a switching signal, rectifying the measurement current in a manner controlled by the switching signal, and outputting a rectified measurement current. A particularly precise detection of the measurement current is thereby achieved.

BRIEF DESCRIPTION OF THE DRAWINGS

The invention is described by way of example below with reference to the drawing, in which an advantageous exemplary embodiment of the invention is illustrated. The drawings show the following.

DETAILED DESCRIPTION

Figure 3:
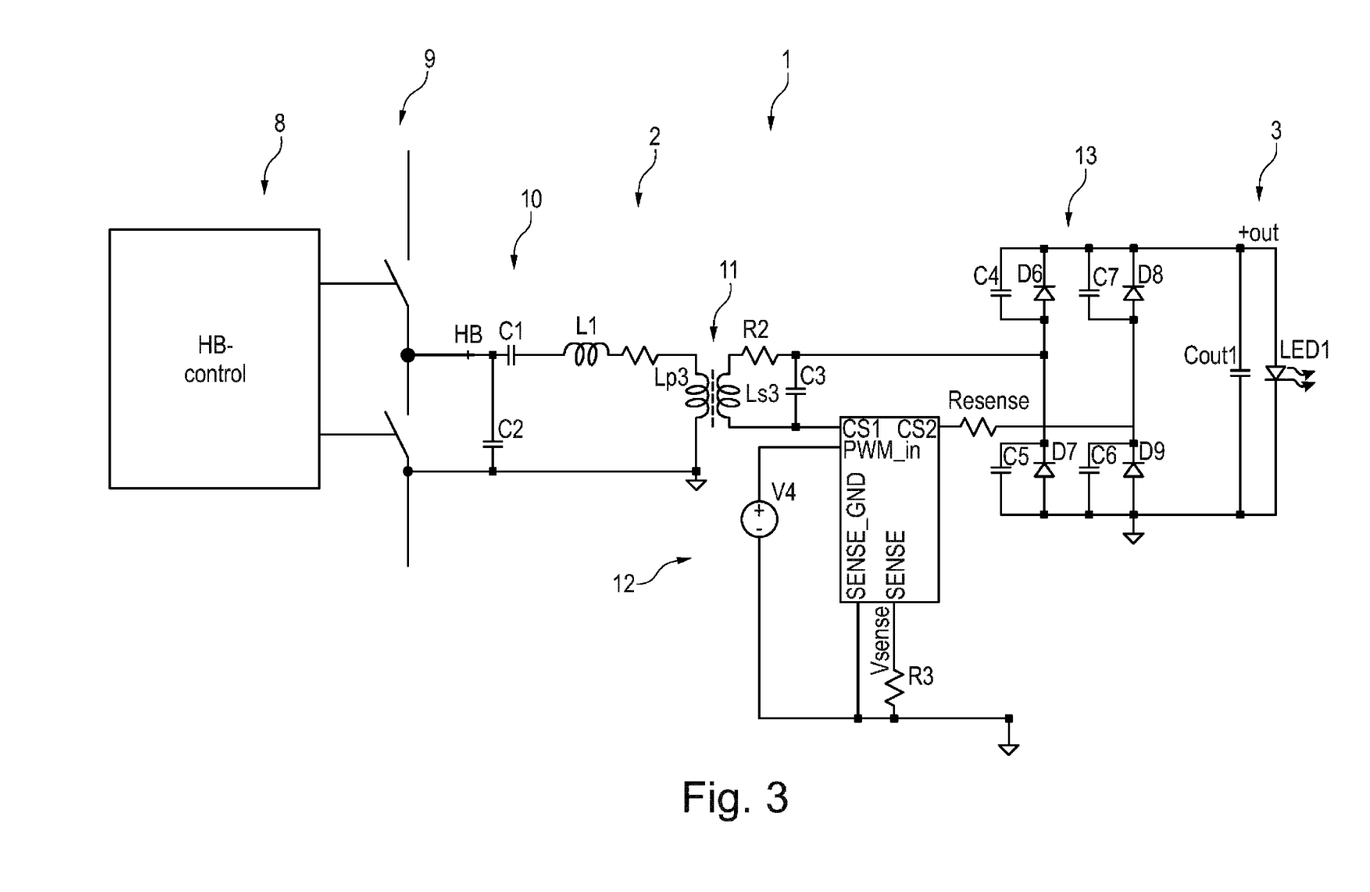
FIG. 3 a second exemplary embodiment of the circuit according to the invention, a second exemplary embodiment of the converter according to the invention and a third exemplary embodiment of the current sensor according to the invention in a circuit diagram.
Figure 4:
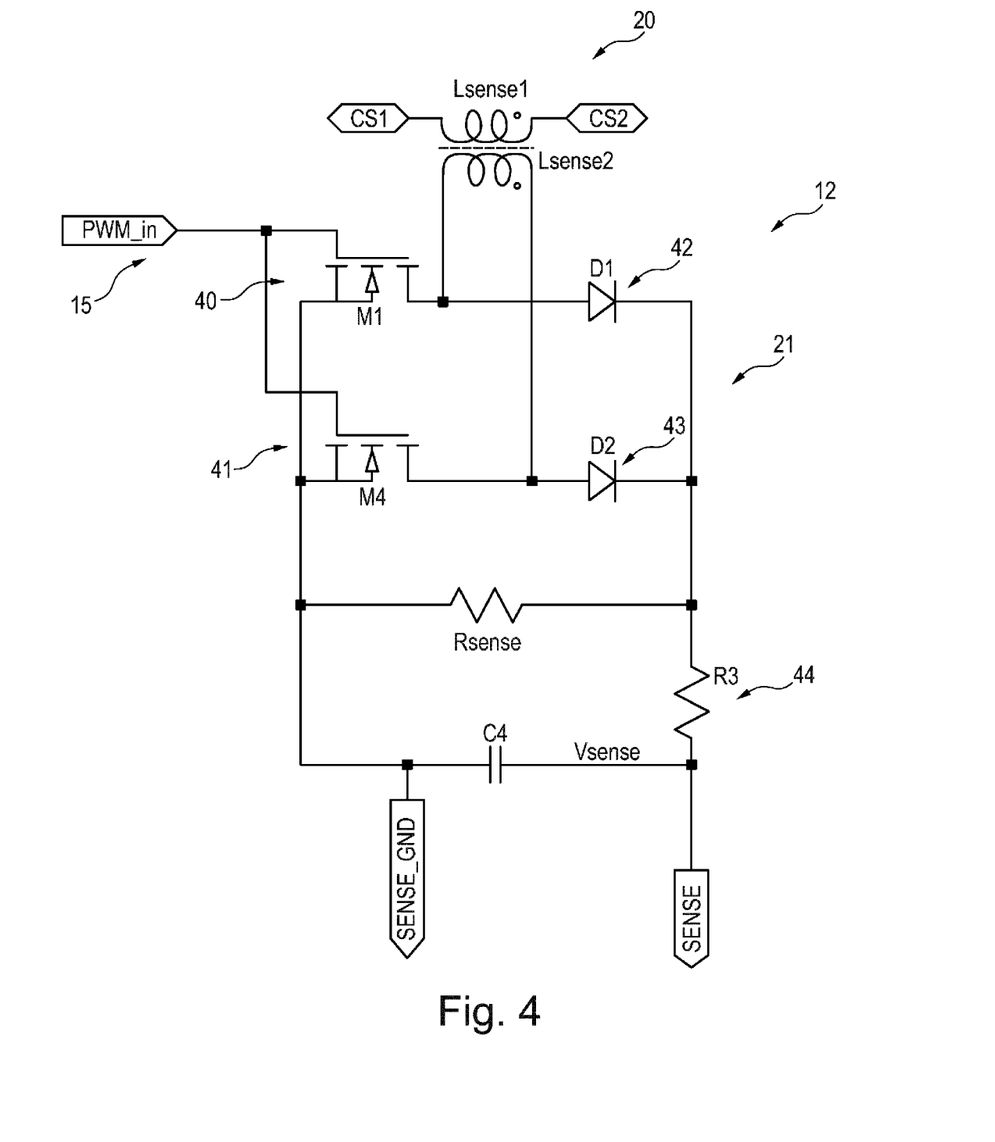
FIG. 4 a fourth exemplary embodiment of the current sensor according to the invention in a detailed circuit diagram.

First, the general functional principle of various exemplary embodiments of the devices according to the invention is illustrated with reference to FIGS. 1-2. With reference to FIGS. 3 and 4, further details of the design and the functional principle are discussed. The functional principle is explained further with reference to FIGS. 5 and 6. Finally, FIG. 7 illustrates the functional principle of an exemplary embodiment of the method according to the invention. Identical elements have not been repeatedly illustrated and described in detail in similar figures.

Figure 1:
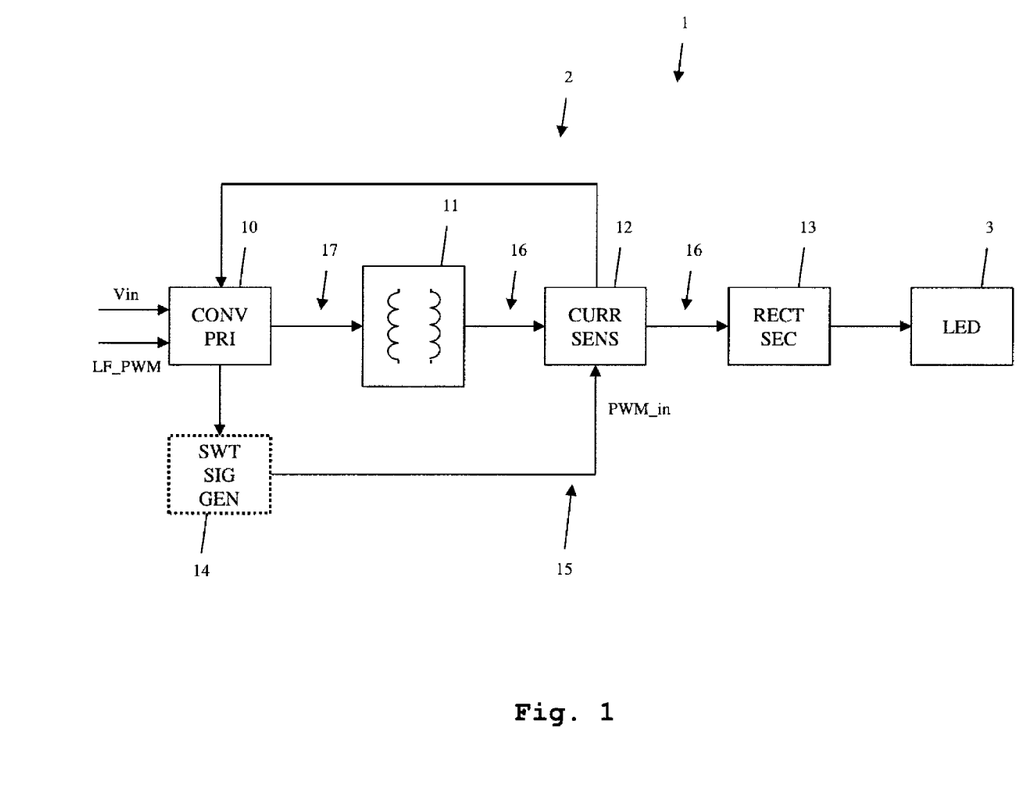
FIG. 1 a first exemplary embodiment of the circuit according to the invention, a first exemplary embodiment of the converter according to the invention and a first exemplary embodiment of the current sensor according to the invention in a block diagram.

FIG. 1 shows a first exemplary embodiment of the circuit 1 according to the invention. The circuit 1 includes a converter 2 according to the invention. The converter 2 includes a primary-side converter device 10 connected to a coupler 11 which is connected to a secondary-side rectifier device 13 by a current sensor 12. The secondary-side rectifier device 13 of the converter 2 is connected to an LED module 3 of the circuit 1.

The converter 2 preferably furthermore includes a switching signal generator 14 connected to the primary-side converter device 10 and the current sensor 12.

In operation, the primary-side converter device 10 is supplied with an input voltage $V_{in}$ and a dimming signal LF_PWM. The input voltage is a direct voltage. The primary-side converter device 10 generates a primary-side alternating current 17 from the input voltage $V_{in}$ and said alternating current is supplied to the coupler 11. On the basis of the dimming signal LF_PWM, dimming occurs at the same time as a result of a 'burst operation' of the half-bridge. In particular, a change in brightness occurs due to a pulse-pause operation (for example in the kHz range, e.g., at 50 kHz; the DC-DC converter itself can then operate in the MHz range, such as 2 or 4 MHz).

The coupler 11 generates a secondary-side alternating current 16 therefrom, which flows through the current sensor 12 and is supplied to the secondary-side rectifier device 13. The secondary-side rectifier device 13 generates an operating current for the LED module 3 therefrom.

The primary-side converter device 10 preferably operates as a half-bridge, i.e., the desired output voltage is generated from the input voltage $V_{in}$ by high-frequency switching of a switch and said output voltage drives the primary-side alternating current. The pulse-width-modulated signal is smoothed again at the output of the DC-DC converter.

As described above, during the switch-off times of this half-bridge, erroneous measurements of a conventional current sensor, which is permanently measuring, may occur. These fault currents occur in particular if the current measurement takes place during the OFF phase of the half-bridge. The current sensor 12 according to the invention is thus designed in such a way that it operates on the basis of a switching signal 15. The current sensor thereby detects no fault currents during the switch-off times of the half-bridge. This is discussed in more detail with reference to FIGS. 2 and 4.

The switching signal 15 is generated either directly by the primary-side converter device 10 and supplied to the current sensor 12, or an optional switching signal generator 14 is used to generate the switching signal. In this case, the switching signal generator 14 receives from the primary-side converter device 10 a signal reflecting the switching times of the half-bridge and generates therefrom the switching signal 15 of the current sensor 12.

There is preferably feedback between the current sensor 12 and the primary-side converter device 10, i.e., the switching processes of the primary-side converter device 10 are adjusted on the basis of the current measured by current sensor 12. A particularly precise adjustment of the load current is achieved by this feedback loop or control loop.

Figure 2:
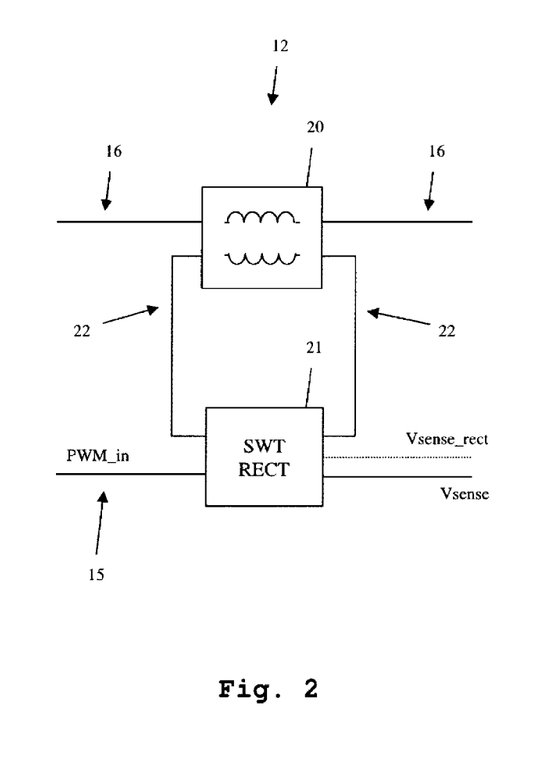
FIG. 2 a second exemplary embodiment of the current sensor according to the invention in a detailed block diagram.

FIG. 2 shows a detailed block diagram of the current sensor 12. The current sensor 12 includes a coupler 20 connected to a switchable rectifier 21. A primary side of the coupler 20 is connected to the secondary side of the coupler 11 and to the secondary-side rectifier device 13 of FIG. 1. The secondary side of the coupler 20 is connected to the switchable rectifier 21. The switchable rectifier 21 includes a switching terminal which is designed to feed in the switching signal 15. In addition, the switchable rectifier outputs the output signal Vsense. Vsense is a voltage corresponding to an average rectified measurement current, while Vsens_rect is a voltage proportional to the rectified measurement current. Optionally, Vsens_rect may be output in addition.

The secondary-side alternating current 16 here flows through the primary side of the coupler 20. A proportional, very small portion of the alternating current 16 is decoupled as an alternating current 22 of the coupler 20 and supplied to the switchable rectifier 21. The switchable rectifier 21 performs rectification for as long as the switching signal 15 specifies it. As long as the switching signal 15 does not specify it, the switchable rectifier 21 does not perform rectification but short-circuits the alternating current 22.

The switching signal 15 is based on the switching behavior of the primary-side converter device 10 from FIG. 1 as described above. In particular, the switching signal 15 corresponds to an inverse of the switching behavior of the half-bridge of the primary-side converter device 10.

This means that during the switch-off phases of the half-bridge, the switching signal 15 is in an ON state. This ON state disables the switchable rectifier 21 during the switch-off phase of the half-bridge of the primary-side converter device 10. During the switch-on phases of the half-bridge of the primary-side converter device 10, the switching signal 15 is in an OFF state, which leads to the switchable rectifier 21 rectifying the measurement current 22 and generating a signal Vsens_rect proportional thereto. The switchable rectifier 21 furthermore comprises a smoothing device which forms an average signal Vsense from the signal Vsens_rect.

FIG. 3 shows a specific circuit diagram of a circuit according to the invention. The circuit 1 comprises a half-bridge 9, a half-bridge controller 8, a converter 2 and an LED module 3. The converter 2 comprises a primary-side converter device 10, a coupler 11, a current sensor 12, and a secondary-side rectifier device 13. In particular, the LED module 3 is connected to the secondary-side rectifier device 13. FIG. 3 shows the current sensor according to the invention merely as an example.

An exact design of the current sensor 12 may be found in FIG. 4. The components which are not essential to the invention have not all been shown and some are not described in detail.

The current sensor 12 includes the previously described coupler 20, which is connected between the secondary side of the coupler 11 and the secondary-side rectifier device 13. In this case, the secondary side of the coupler 20 is connected to the switchable rectifier 21. At a first node, two transistors 40, 41 are connected in parallel as active switching elements on the input side. At a second node, the transistor 40 is connected in series with a diode 42 and additionally connected to a first terminal of the secondary side of the coupler 20. At a third node, the transistor 41 is connected in series with a diode 43 and additionally connected to the second terminal of the secondary side of the coupler 20. At a fourth node, the diodes 42, 43 are connected in parallel on the output side.

In this case, the rectified measurement current is generated between the first node and the fourth node and flows via a resistor $R_{SENSE}$, thus generating the voltage Vsens_rect. This voltage can optionally be output in addition.

Control terminals of the transistors 40, 41 are supplied with the switching signal 15 in this case. At the fourth node, the voltage Vsens_rect, which is proportional to the rectified measurement current, is generated.

The current sensor 12 furthermore has a smoothing device 44 which consists of a capacitor C4 and an ohmic resistor R3. The smoothing device performs a smoothing of the voltage Vsens_rect and thereby generates the voltage sens, which is proportional to an average rectified measurement current.

Since the transistors 40, 41 only conduct current in a manner controlled by the switching signal 15 while the half-bridge of the primary-side converter device 10 is switched on, rectification by the switchable rectifier 21 takes place only at these times. While the half-bridge is switched off, no rectification takes place by a switchable rectifier 21. Consequently, the signal Vsens_rect is 0 at these times, which results in a reduction of the Vsense signal.

In the embodiment shown here, two active switching elements, the transistors 40, 41, are used in the rectifier for the low-side rectifier elements. In this case, they each have a preferably integrated freewheeling diode 42, 43. If the two lower rectifying elements are controlled, this can take place without complex high-side control. Alternatively, however, an exemplary embodiment with two additional active components instead of the freewheeling diodes 42, 43 is conceivable.

Figure 5:
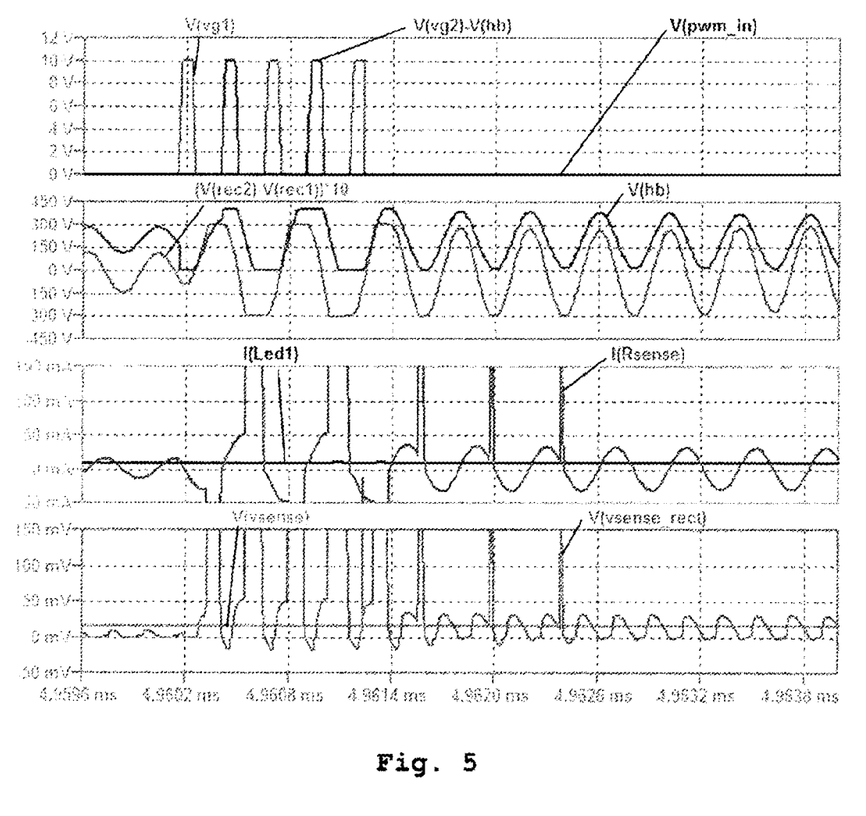
FIG. 5 voltage characteristics and current characteristics in an exemplary converter in which no controlled rectification according to the invention takes place.

FIG. 5 shows exemplary currents and voltage characteristics without using the switching signal 15, which is referred to herein as Vpwm_in. This thus corresponds to a conventional converter.

In the first diagram from the top, the switching pulses of the half-bridge during the switch-on time of the half-bridge are clearly recognizable as signals V(Vg1) and V(Vg2)-V (hb).

The output voltage of the half-bridge V(hb) and the secondary-side output voltage Vrec2-Vrec1 are shown in the second diagram from the top.

In the third diagram from the top, a load current I(Led1) and a current I(Rsense) detected by a current sensor are shown. It is clear here that a current is detected by the current sensor during the switching times of the half-bridge and also during the switch-off time of the half-bridge, although only fault currents are present during the switch-off time of the half-bridge.

In the lowest diagram, the corresponding curves of the voltages Vsense_rect and Vsense are shown. It can be clearly seen that the fault currents lead to pulses being measured during the switch-off time of the half-bridge, which falsifies the measurement.

Figure 6:
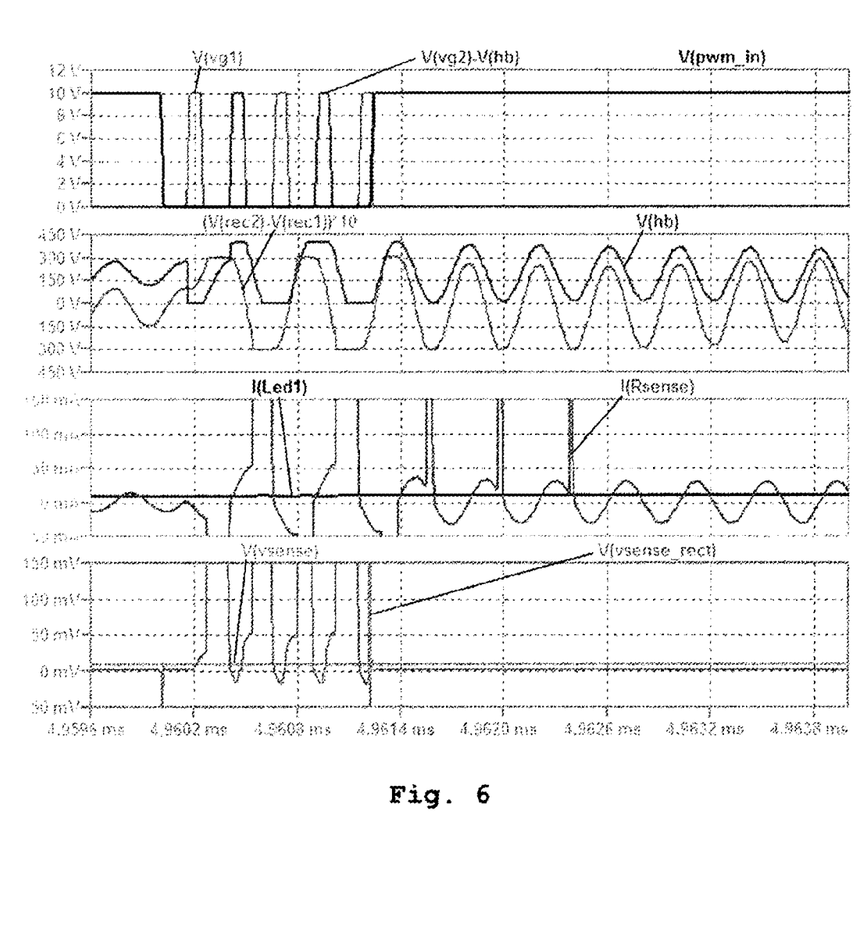
FIG. 6 exemplary voltage characteristics and current characteristics in a third exemplary embodiment of the converter according to the invention in which a controlled rectification according to the invention takes place, and FIG. 7 an exemplary embodiment of the method according to the invention in a flow chart.
Figure 7:
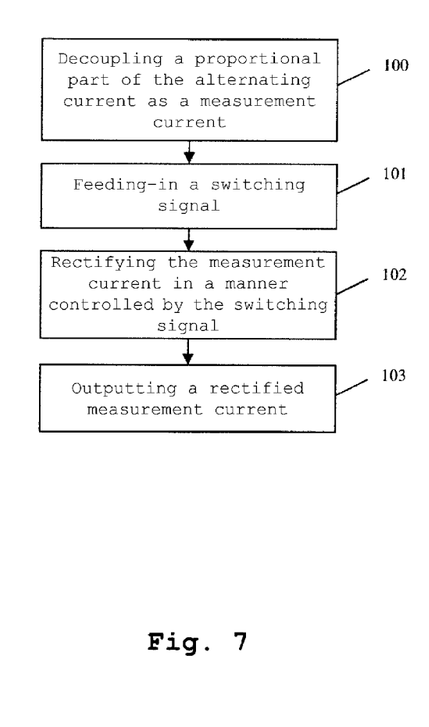

FIG. 6 shows the same signals as in FIG. 5, but with a switched rectifier being used within the current sensor. It can now be clearly seen in the first diagram from the top that the control signal Vpwm_in has a high level during the switch-off time of the half-bridge, said level corresponding to an ON state. As a result, the signal Vsens_rect does not reflect the measurement current during this switch-off time since the measurement current only consists of fault current at this time. A significantly lower value Vsense is thus obtained compared to the fault-current value from FIG. 5.

Finally, FIG. 7 shows an exemplary embodiment of the method according to the invention in a flow chart. In a first step 100, a proportional part of the alternating current is decoupled as an alternating current; in a second step 101, a switching signal is fed in. In a third step 102, rectification of the measurement current takes place in a manner controlled by the switching signal. In a fourth step 103, a rectified measurement current is output.

It is important here to mention that the method according to the invention and the device according to the invention correspond very closely to one another and the statements regarding the device according to the invention are thus in any case applicable to the method according to the invention.

The device according to the invention and the method according to the invention enable a very precise measurement over the entire dimming range. Diode capacitances no longer falsify the measurement. This enables a particularly great freedom in the selection of components. This current detection can be used in externally controlled and self-oscillating half-bridges with pulse-width modulation operation.

The invention is not limited to the exemplary embodiment illustrated. All features described above or features shown in the figures can advantageously be combined with one another as desired within the scope of the invention.

The invention claimed is:

1. A current sensor (12) for detecting an alternating current (16), comprising:
   a coupler (20) designed to decouple a proportional part of the alternating current (16) as a measurement current (22);
   a switching terminal designed to feed in a switching signal (15); and
   a switchable rectifier (21) designed to rectify the measurement current (22) in a manner controlled by the switching signal (15) and to output it as a rectified measurement current (Vsense);
   wherein the switchable rectifier (21) includes a switching device (40, 41) designed to switch rectification by the switchable rectifier (21) on and off in a manner controlled by the switching signal (15);
   wherein the switchable rectifier (21) comprises a first transistor (40), a first diode (42), a second transistor (41), and a second diode (43);
   wherein at a first node, the first transistor (40) and the second transistor (41) are connected in parallel on the input side;
   wherein at a second node, the first diode (42) is connected in series with the first transistor (40);
   wherein at a third node, the second diode (43) is connected in series with the second transistor (41); and
   wherein at a fourth node, the first diode (42) and the second diode (43) are connected in parallel on the output side.

2. The current sensor (12) according to claim 1, wherein the switching device (40, 41) comprises at least two transistors (40, 41) designed to switch rectification by the switchable rectifier (21) on and off in a manner controlled by the switching signal (15).

3. The current sensor (12) according to claim 1, wherein the switchable rectifier (21) is designed to receive the measurement current (22) at the second node and the third node, and
the switchable rectifier (21) is designed to output the rectified measurement current (Vsense) at the first node and the fourth node.

4. A converter (2) comprising:
a primary-side converter device (10);
a first coupler (11);
a secondary-side rectifier device (13); and
a current sensor (12) for detecting an alternating current (16), comprising:
   a second coupler (20) designed to decouple a proportional part of the alternating current (16) as a measurement current (22);
   a switching terminal designed to feed in a switching signal (15); and
   a switchable rectifier (21) designed to rectify the measurement current (22) in a manner controlled by the switching signal (15) and to output it as a rectified measurement current (Vsense);
wherein the switching signal (15) is based on switching times of the primary-side converter device (10).

5. The converter (2) according to claim 4, comprising:
a switching signal generator (14) designed to generate the switching signal (15) on the basis of switching times of the primary-side converter device (10).

6. The converter (2) according to claim 5,
wherein the switching signal generator (14) is designed to generate the switching signal (15) as inverse of the switching processes of a half-bridge of the primary-side converter device (10).

7. The converter (2) according to claim 6,
wherein the switchable rectifier (21) is designed to
rectify the measurement current (22) during a switch-on phase of the half-bridge of the primary-side converter device (10), and
not rectify the measurement current (22) during a switch-off phase of the half-bridge of the primary-side converter device (10).

8. The converter (2) according to claim 4,
wherein the primary-side converter device (10) is designed to operate on the basis of the rectified measurement current (Vsense).

9. A circuit (1) comprising the converter (2) according to claim 8; and an LED module (3).

10. A method for detecting an alternating current (16) using the current sensor in the circuit according to claim 4, comprising:
   decoupling (100) a proportional part of the alternating current (16) as a measurement current (22);
   feeding-in (101) a switching signal (15);
   rectifying (102) the measurement current (22) in a manner controlled by the switching signal (15); and
   outputting (103) a rectified measurement current (Vsense).

* * * * *